(12) United States Patent
Vandivier et al.

(10) Patent No.: US 7,739,567 B2
(45) Date of Patent: Jun. 15, 2010

(54) UTILIZING SERIALIZER-DESERIALIZER TRANSMIT AND RECEIVE PADS FOR PARALLEL SCAN TEST DATA

(75) Inventors: Suzette D. Vandivier, Fort Collins, CO (US); Aaron M. Volz, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 337 days.

(21) Appl. No.: 12/037,157

(22) Filed: Feb. 26, 2008

(65) Prior Publication Data

US 2009/0217113 A1 Aug. 27, 2009

(51) Int. Cl.
  *G01R 31/28* (2006.01)
(52) U.S. Cl. .................. 714/727; 714/724
(58) Field of Classification Search .................. 714/727
See application file for complete search history.

(56) References Cited

U.S. PATENT DOCUMENTS

| | | | |
|---|---|---|---|
| 6,653,957 B1* | 11/2003 | Patterson et al. ............ 341/100 |
| 7,352,169 B2* | 4/2008 | Abraham et al. .......... 324/158.1 |
| 7,401,276 B2* | 7/2008 | Matsumoto et al. ......... 714/724 |
| 7,464,307 B2* | 12/2008 | Nejedlo et al. .............. 714/712 |
| 7,519,891 B2* | 4/2009 | Zimmerman ................ 714/738 |
| 2005/0114733 A1* | 5/2005 | Sul et al. ...................... 714/30 |
| 2007/0115831 A1* | 5/2007 | Sharma et al. .............. 370/241 |

\* cited by examiner

*Primary Examiner*—James C Kerveros

(57) ABSTRACT

A Serializer/De-serializer (SerDes) of an integrated circuit (IC) includes selectable inputs and outputs not only for functional data and boundary scan (e.g., JTAG) test data, but also for parallel-scan test data. The serializing portion of the SerDes includes multiplexing logic responsive to control signals to select or identify one of the multiplexing logic inputs for functional data, boundary scan data and parallel-scan data. The de-serializing portion similarly includes selection logic responsive to such control signals to select or identify one of the selection logic outputs for functional data, boundary scan data and parallel-scan data. The multiplexing logic and selection logic couple the selected input or output, respectively, to the SerDes input/output pads.

5 Claims, 2 Drawing Sheets

UTILIZING SERIALIZER-DESERIALIZER TRANSMIT AND RECEIVE PADS FOR PARALLEL SCAN TEST DATA

BACKGROUND

As integrated circuits (ICs), especially application-specific ICs (ASICs), have become increasingly complex, testing their functionality to ensure that they operate properly has become increasingly challenging. IC testing involves two general categories: functional testing and structural testing. Functional testing involves stimulating the primary inputs of the IC and measuring the results at the primary outputs of the integrated circuit. Functional testing exercises the functionality of logic elements within the IC and is a time-honored method of testing that the IC can perform its intended operations. However, creating a robust functional test for a complex IC is very labor intensive, and attendant test equipment can be uneconomical.

To economize effort and cost involved in IC testing, structural testing has emerged as an alternative to functional testing. In a structural test, the internal storage elements of the IC are used to control and observe the IC internal logic. This is generally done by linking the storage elements into a serial shift register or "scan chain" when a test mode signal is applied. This technique is commonly referred to as "scan testing." Generally, an IC having scan testing capability includes a number of scan chains, each comprising a number of interconnected multiplexers and registers connected to the functional logic of the integrated circuit. The registers in a scan chain are typically implemented using D flip-flops. A scan chain can be many hundreds of thousands of flip-flops in length, and is generally divided into a smaller number of shorter scan chains, each typically comprising on the order of one hundred to one thousand flip-flops and multiplexers.

During scan testing, scan data that is provided to the IC at an input/output (I/O) pad is serially clocked into, i.e., loaded into, the scan chain registers. After the scan data is loaded, a primary input state is applied to the combinational logic of the integrated circuit. The combination of the scanned-in present state and the applied primary inputs comprises the test stimulus. The values of the primary outputs are then measured and a single clock cycle is executed to capture the response of the circuit to the stimulus. To complete the scan test, the values captured in the registers are then serially scanned out of the scan chain to an I/O pad. Scan chains can be scanned out serially, i.e., one after another. Alternatively, multiple scan chains can be scanned out in parallel. Parallel scan can be much faster than serial scan if a sufficient number of I/O pads are used.

Another type of testing is known as boundary scan. Boundary scan is a method for testing interconnects between devices on printed circuit boards or between sub-blocks inside an IC. Boundary scan testing has been standardized by the Joint Test Action Group (JTAG) as IEEE Std. 1149.1. For purposes of board-level testing, a JTAG-enabled IC includes dedicated "test cells" connected to each I/O pad of the IC that can selectively override the functionality of that pad when instructed to enter a JTAG test mode. These cells can be programmed via the JTAG scan chain to drive a signal onto a pad and across an individual trace on a circuit board. The cell at the destination of the board trace can be programmed to read the value at the pad, verifying that the board trace properly connects the two pads. In the case of performing boundary scan testing between IC sub-blocks, test cells disposed between the sub-blocks allow the sub-blocks to be controlled in the same manner as if they were physically independent circuits.

Increasing IC complexity has strained I/O pad resources. That is, a more complex IC of the same physical dimensions as a less complex IC will generally have no more I/O pads available to transfer data to and from it than the less complex IC. I/O pads are used not only to transmit and receive functional data, i.e., data that relates to the IC's primary function (for example, a microprocessor function), but also parallel-scan test data. While in some ICs the same I/O pad serves to transfer both functional data in the IC's normal operational mode and parallel-scan data in a test mode, it would still be desirable to maximize the I/O available for parallel-scan testing. In general, the less I/O that is available for parallel-scan testing, the larger the test vector depth and longer the wafer and package tests.

In part to alleviate the strain on standard I/O pad resources, ICs have incorporated increasing numbers of Serializer/Deserializers or "SerDes." (The term "standard I/O pad" is used herein to refer to an I/O pad that is not a SerDes I/O pad.) A SerDes is logic that converts data that exists inside the IC in parallel form into a serial bit stream for output from the chip, and converts a serial bit stream input to the chip into parallel form for use inside the IC. A high-speed SerDes I/O pad can provide higher bandwidth data transfer than a standard I/O pad. For this reason, SerDes is becoming the dominant technique for transferring data into and out of ICs. (The term "SerDes" is commonly used to refer both to the logic itself as well as the technique or method by which it operates.)

The data signals for which a SerDes has been used for inter-chip transfer include not only functional data, but also JTAG data. That is, a SerDes transmitter (i.e., the serializer portion) can have as its inputs both a functional data signal and a JTAG data signal, and include a multiplexer that selects whether the SerDes is to output (out of the IC) the serialized functional data or, alternatively, the JTAG data on its associated SerDes I/O pad. Likewise, a SerDes receiver (i.e., the de-serializer portion) can have as its outputs both a functional data signal and a JTAG data signal, and include selection circuitry that selects whether the SerDes is to output (to other circuitry in the IC) the parallelized functional data or, alternatively, the JTAG data.

Some SerDes use differential, rather than single-ended, I/O pads. One pair of SerDes I/O pads transmits "true" and "complement" output signals, and another pair of SerDes I/O pads receives true and complement input signals. The IEEE Std. 1149.6 extends the 1149.1 (JTAG) boundary scan testing standard to allow testing of differential-mode circuitry via such I/O pads.

SUMMARY

In exemplary embodiments of the invention, the Serializer/De-serializer (SerDes) of an integrated circuit (IC) includes selectable inputs and outputs not only for functional data and boundary scan (e.g., JTAG) data, but also for parallel-scan data. The serializing portion of the SerDes includes multiplexing logic responsive to control signals to select or identify one of the multiplexing logic inputs, and the de-serializing portion similarly includes selection logic responsive to such control signals to select or identify one of the selection logic outputs.

The multiplexing logic couples a first multiplexing logic input to the functional logic of the IC to receive functional data in response to a first control signal state. The multiplexing logic couples a second multiplexing logic input to the boundary scan logic to receive boundary scan data in response to a second control signal state. The multiplexing logic couples a third multiplexing logic input to the parallel-scan chain logic to receive parallel-scan data in response to a third control signal state.

The selection logic couples a first selection logic output to the functional logic to provide functional data in response to the first control signal state. The selection logic couples a second selection logic output to the boundary scan logic to provide boundary scan data in response to the second control signal state. The selection logic couples a third selection logic output to the parallel-scan logic to provide parallel-scan data in response to the third control signal state.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
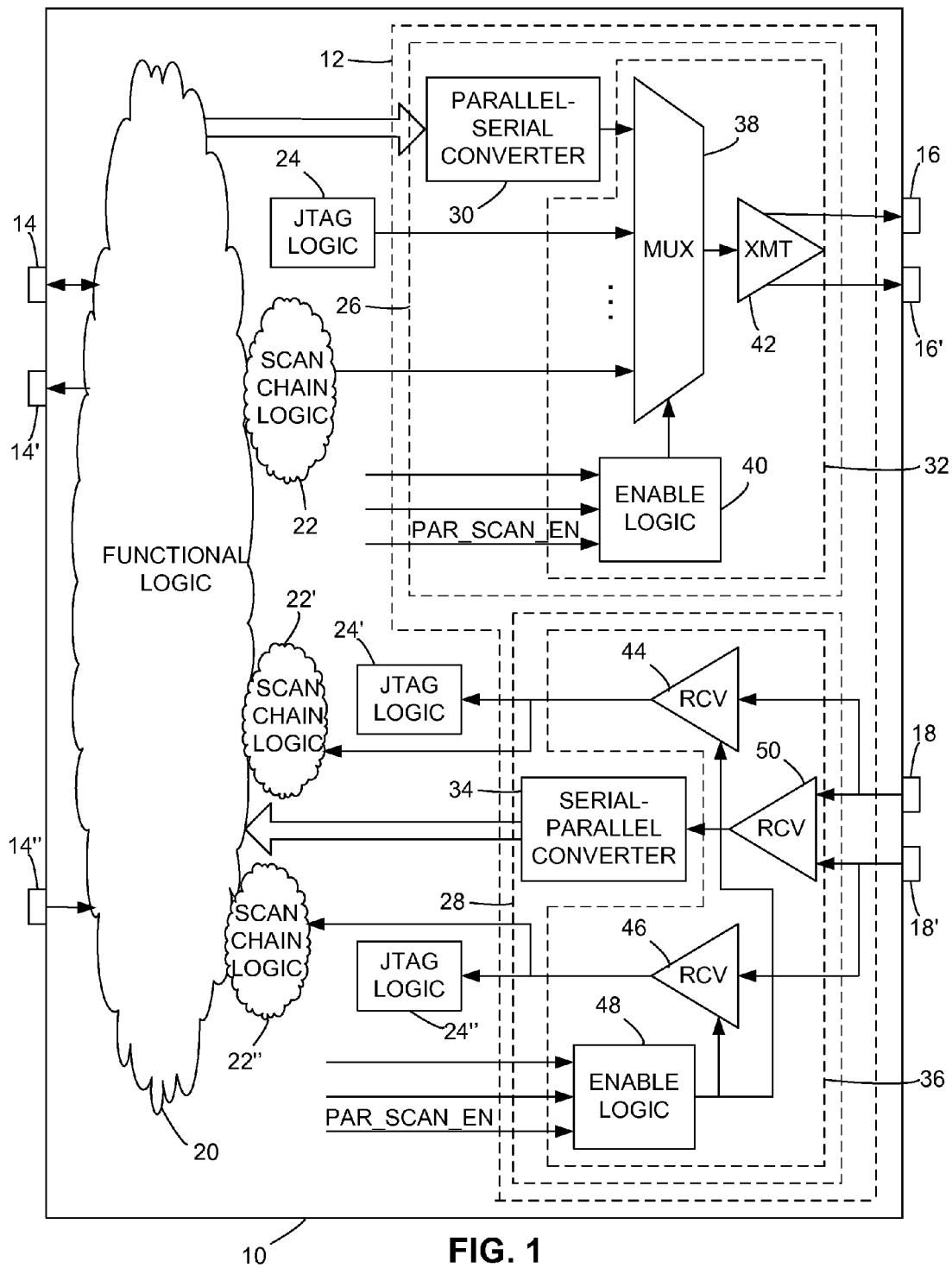
FIG. 1 is a block diagram of an integrated circuit having functional logic, boundary scan logic, parallel scan logic, and one or more Serializer/De-serializers (SerDes), wherein parallel-scan data is passed through the same SerDes through which boundary scan and functional data are passed.

In one exemplary embodiment of the invention, an integrated circuit (IC) 10 includes a Serializer/De-serializer (SerDes) 12. Although only one SerDes 12 is shown for purposes of clarity, IC 10 can have many others. IC 10 includes standard input/output (I/O) pads 14, 14', 14", etc., as well as SerDes I/O pads 16 and 18. IC 10 can have many more such standard I/O pads 14 and SerDes I/O pads 16 and 18, but only a few exemplary I/O pads are shown in FIG. 1 for purposes of clarity.

IC 10 further includes conventional functional logic 20 that effects whatever the primary functions of IC 10 may be. For example, in an embodiment in which IC 10 comprises a microprocessor, functional logic 20 effects the various functions that characterize the microprocessor. (Indeed, in an application-specific IC (ASIC), the "application" comprises the function or functions.) Accordingly, functional logic 20 forms the bulk of the logic of IC 10. In addition, IC 10 includes conventional parallel-scan chain logic 22, 22', 22", etc., for performing parallel-scan tests of functional logic 20. Although parallel-scan chain logic 22, 22" and 22" are shown as separate elements for purposes of clarity, they can be portions of the same logic or otherwise interrelated. Parallel-scan chain logic 22 represents that portion or interface which is used for reading parallel-scan data out of IC 10, and parallel-scan chain logic 22' and 22" represent portions or interfaces that are used for inputting parallel-scan data into IC 10. As described in further detail below, instead of (or in addition to) inputting and outputting parallel-scan data through standard I/O pads 14 in the conventional manner, parallel-scan data is input and output through SerDes I/O pads 16 and 18 in accordance with the invention. Although parallel-scan data is input and output in a novel manner in accordance with the invention, the parallel-scan tests of functional logic 20 can themselves be performed in any suitable conventional manner. As parallel-scan tests themselves are well understood by persons skilled in the art to which the invention relates, they are not described herein.

IC 10 also includes conventional JTAG logic 24, 24', 24", etc., for performing JTAG or similar boundary scan tests. Although JTAG logic 24, 24' and 24" are shown as separate elements for purposes of clarity, they can be portions of the same logic or otherwise interrelated. JTAG boundary scan data is input and output through SerDes I/O pads 16 and 18 as described below. The JTAG boundary scan tests themselves can be performed in any suitable conventional manner. As JTAG boundary scan tests are well understood by persons skilled in the art to which the invention relates, they are not described herein.

SerDes 12 comprises a serializer portion 26 and a de-serializer portion 28. Serializer portion 26 comprises parallel-to-serial converter logic 30 and multiplexing logic 32. De-serializer portion 28 comprises serial-to-parallel converter logic 34 and selection logic 36. Parallel-to-serial converter logic 30 and serial-to-parallel converter logic 34 can be of the types conventionally included in SerDes for transferring data in and out of functional logic 20.

Multiplexing logic 32 comprises a multiplexer 38 and enable logic 40. For reference purposes, the differential transmitter 42 that receives the output of multiplexer 38 can be considered as part of multiplexing logic 32 or, alternatively, as a separate element of serializer portion 26. The true and complement outputs of differential transmitter 42 are coupled to SerDes I/O pads 16 and 16', respectively.

Enable logic 40 controls multiplexer 38. It receives as its inputs a number of control signals, in combination defining a control signal state. The control signal state can include any suitable control signals of the types conventionally used in SerDes to control such multiplexing logic. For example, conventionally, at least one such control signal is provided to identify either functional logic 20 or JTAG logic 24 as the input to be multiplexed, i.e., coupled or routed to the multiplexer output. As indicated by the ellipsis symbol (" . . . "), multiplexer 38 can have any other suitable inputs in addition to those specifically described herein. In accordance with the present invention, one such input is the output of parallel-scan chain logic 22. Accordingly, another such control signal (which can be referred to as PAR_SCAN_ENABLE) is provided to identify parallel-scan chain logic 22 as the input to be multiplexed, i.e., coupled or routed to the output of multiplexer 38. Enable logic 40 is thus configured to respond to the combination of such control signals, i.e., the control signal state, variously indicating one of a functional data mode, a JTAG boundary scan test mode, or a parallel scan test mode, by causing multiplexer 38 to couple or route the corresponding input to its output.

That is, if the control signal state indicates functional data mode, then enable logic 40 causes multiplexer 38 to route the functional logic data that parallel-to-serial converter 30 converts to a serial data stream to the output of multiplexer 38 and, ultimately, to SerDes I/O pads 16 and 16' via differential transmitter 42. In this mode, functional data produced by functional logic 20 is thus output from IC 10 via SerDes 12. Likewise, if the control signal state indicates JTAG boundary scan mode, then enable logic 40 causes multiplexer 38 to route the JTAG data collected by JTAG logic 24 to the output of multiplexer 38 and, ultimately, to SerDes I/O pads 16 and 16' via differential transmitter 42. In this mode, JTAG data is thus output from IC 10 via SerDes 12. Lastly, if the control signal state indicates parallel-scan test mode, then enable logic 40 causes multiplexer 38 to route the boundary scan data collected by parallel-scan chain logic 22 to the output of multiplexer 38 and, ultimately, to SerDes I/O pads 16 and 16' via differential transmitter 42. In this mode, parallel-scan test data is thus output from IC 10 via SerDes 12.

Selection logic 36 comprises receivers 44 and 46 and enable logic 48. For reference purposes, the differential receiver 50 that receives the true and complement input signals from SerDes I/O pads 18 and 18', respectively, can be considered as part of selection logic 36 or, alternatively, as a separate element of de-serializer portion 28. Serial-to-parallel converter 34 receives the output of differential receiver 50 and provides the resulting (parallel) data to functional logic 20.

Enable logic 48 receives as its inputs a number of control signals, in combination defining a control signal state. Enable logic 48 turns on or activates one or both of receivers 44 and 46 when the control signal PAR_SCAN_ENABLE is asserted, indicating parallel-scan test mode, or when another signal indicating JTAG boundary scan mode is asserted. Thus, in addition to conventional control signals of the types used in SerDes to indicate one of a functional logic mode and a JTAG boundary scan mode, PAR_SCAN_ENABLE is provided to indicate a parallel-scan test mode.

When the control signal state indicates the functional data mode, functional data input to IC 10 at SerDes I/O pads 18 is routed to functional logic 20. When the control signal state indicates JTAG boundary scan mode, enable logic 48 enables receivers 44 and 46 to route JTAG boundary scan data input to IC 10 at SerDes I/O pads 18 and 18' to JTAG logic 24' and 24", respectively. Note that there are two independent JTAG data input paths: receiver 44 receives JTAG data from SerDes I/O pad 18 and provides it to JTAG logic 24'; and receiver 46 receives JTAG data from SerDes I/O pad 18' and provides it to JTAG logic 24". Similarly, when the control signal state indicates parallel-scan test mode, enable logic 48 enables receivers 44 and 46 to route parallel-scan data input to IC 10 at SerDes I/O pads 18 and 18' to parallel-scan chain logic 22' and 22", respectively. Similarly note that there are two independent parallel-scan data input paths: receiver 44 receives parallel-scan data from SerDes I/O pad 18 and provides it to parallel-scan logic 22'; and receiver 46 receives parallel-scan data from SerDes I/O pad 18' and provides it to parallel-scan logic 22". In each case, the two independent data paths result from using SerDes I/O pads 18 and 18' as independent inputs when they are not in use receiving functional data.

Figure 2:
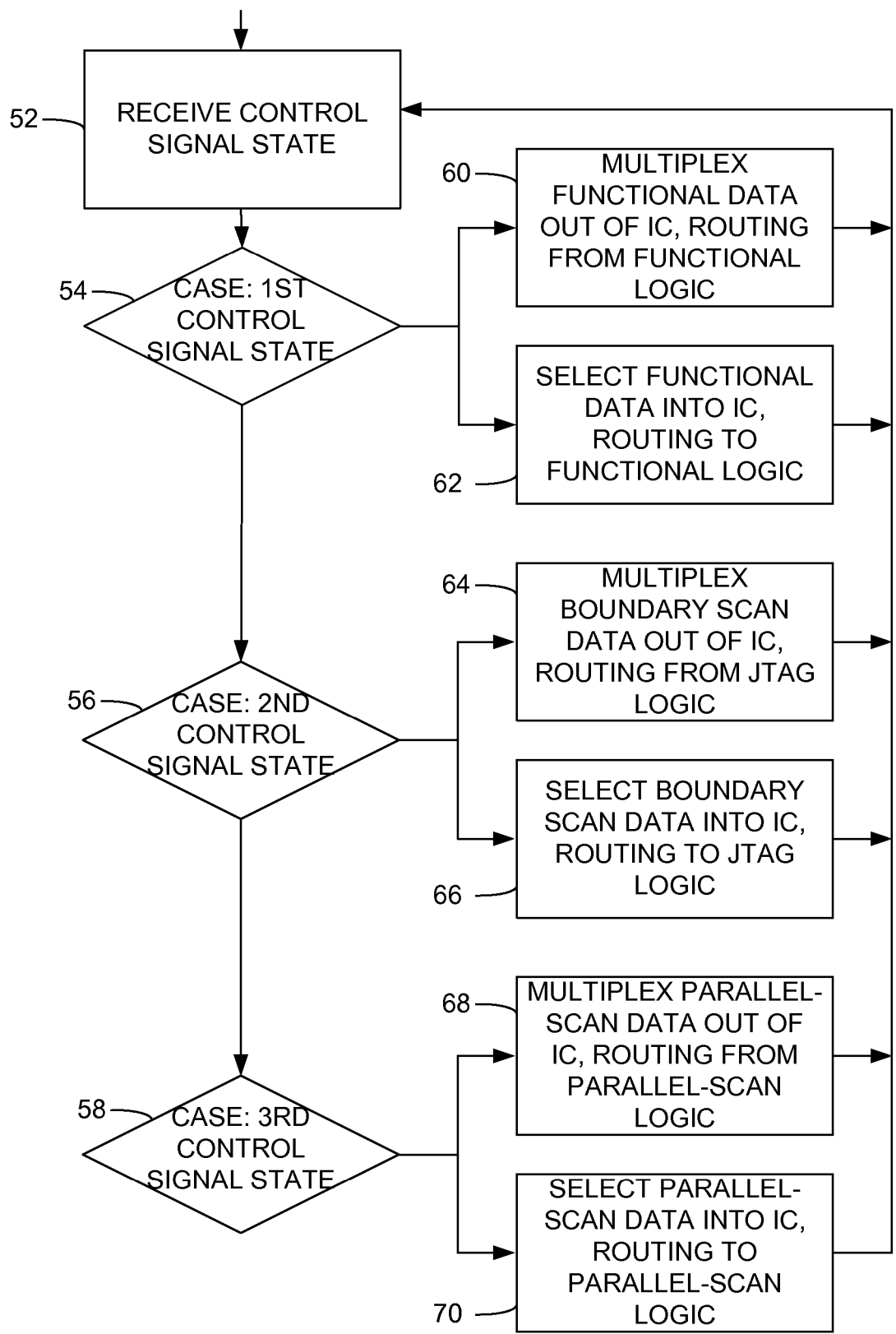
FIG. 2 is a flow diagram illustrating operation of the SerDes of FIG. 1.

In the exemplary embodiment of the invention, SerDes 12 operates in accordance with the method illustrated in FIG. 2. As indicated by step 52, enable logic 40 and 48 receive a control signal state comprising one or more control signals indicating one of a number of operational modes: a first control signal state indicates a functional data mode; a second control signal state indicates a (JTAG) boundary scan test mode; and a third control signal state indicates a parallel-scan test mode. As indicated by steps 54, 56 and 58, respectively, multiplexing logic 32 and selection logic 36 respond to the control signal state. In the case of the first control signal state, multiplexing logic 32 responds by routing functional data from functional logic 20 to SerDes I/O pads 16, as indicated by step 60, and selection logic 36 responds by routing functional data received on SerDes I/O pads 18 to functional logic 20, as indicated by step 62. In the case of the second control signal state, multiplexing logic 32 responds by routing (JTAG) boundary scan data from JTAG logic 24 to SerDes I/O pads 16, and selection logic 36 responds by routing JTAG data received on SerDes I/O pads 18 to JTAG logic 24' and 24". In the case of the third control signal state, multiplexing logic 32 responds by routing parallel-scan data from parallel-scan chain logic 22 to SerDes I/O pads 16, and selection logic 36 responds by routing parallel-scan data received on SerDes I/O pads 18 to parallel-scan chain logic 22' and 22".

As many ASIC architectures have a large number of SerDes I/O pads in relation to the number of standard I/O pads, using SerDes I/O for parallel-scan testing in accordance with the invention can shorten production test time over using standard I/O alone. It should also be noted that although the invention has been described above with regard to an exemplary embodiment in which SerDes I/O is used for parallel-scan testing, in other embodiments a combination of SerDes I/O and standard I/O can be used for parallel-scan testing to further enhance efficiency.

One or more illustrative embodiments of the invention have been described above. However, it is to be understood that the invention is defined by the appended claims and is not limited to the precise embodiments described.

What is claimed is:

1. An integrated circuit, comprising:
    functional logic relating to a primary function of the integrated circuit;
    parallel-scan chain logic for integrated circuit structural testing;
    boundary scan logic for boundary scan testing; and
    serializer/de-serializer (SerDes) logic, the SerDes logic comprising serializer logic and de-serializer logic, the serializer logic comprising multiplexing logic responsive to control signals, and the de-serializer logic comprising selection logic responsive to the control signals, wherein:
        the multiplexing logic couples a first multiplexing logic input to the functional logic to receive functional data in response to a first control signal state;
        the multiplexing logic couples a second multiplexing logic input to the boundary scan logic to receive boundary scan data in response to a second control signal state;
        the multiplexing logic couples a third multiplexing logic input to the parallel-scan chain logic to receive parallel-scan data in response to a third control signal state;
        the selection logic couples a first selection logic output to the functional logic to provide functional data in response to the first control signal state;
        the selection logic couples a second selection logic output to the boundary scan logic to provide boundary scan data in response to the second control signal state; and
        the selection logic couples a third selection logic output to the parallel-scan logic to provide parallel-scan data in response to the third control signal state;
    at least one serial data output pad element coupled to an output of the multiplexing logic; and
    at least one serial data input pad element coupled to an input of the selection logic.

2. The integrated circuit claimed in claim 1, wherein:
    the serial data output pad element comprises a pair of differential output pads; and
    the serial data input pad element comprises a pair of differential input pads.

3. The integrated circuit claimed in claim 2, wherein:
    the third selection logic output defines a first parallel-scan data input coupleable to a first one of the differential input pads in response to the third control signal state; and the third selection logic output defines a second parallel-scan data input coupleable to a second one of the differential input pads in response to the third control signal state.

4. A method for serial data input and output in an integrated circuit (IC) having serializer/de-serializer (SerDes) logic, the SerDes logic comprising serializing logic having multiplexing logic and de-serializing logic having selection logic, the multiplexing logic and selection logic responsive to control signals, the method comprising:

receiving a control signal state represented by a combination of the control signals;

the multiplexing logic coupling a first multiplexing logic input to the functional logic to receive functional data in response to a first control signal state;

the multiplexing logic coupling a second multiplexing logic input to the boundary scan logic to receive boundary scan data in response to a second control signal state;

the multiplexing logic coupling a third multiplexing logic input to the parallel-scan chain logic to receive parallel-scan data in response to a third control signal state;

the selection logic coupling a first selection logic output to the functional logic to provide functional data in response to the first control signal state;

the selection logic coupling a second selection logic output to the boundary scan logic to provide boundary scan data in response to the second control signal state; and the selection logic coupling a third selection logic output to the parallel-scan logic to provide parallel-scan data in response to the third control signal state.

5. The method claimed in claim 4, wherein:

the third selection logic output defines a first parallel-scan data input, and the third selection logic couples the first parallel-scan data input to a first input pad of a pair of differential input pads in response to the third control signal state; and the third selection logic output defines a second parallel-scan data input, and the third selection logic couples the second parallel-scan data input to a second input pad of the pair of differential input pads in response to the third control signal state.

* * * * *